United States Patent [19]

Salet

[11] Patent Number: 5,818,862
[45] Date of Patent: Oct. 6, 1998

[54] SURFACE EMITTING SEMICONDUCTOR LASER

[75] Inventor: Paul Salet, Clamart, France

[73] Assignee: Alcatel Alsthom Compagnie Generale d'Electricite, Paris, France

[21] Appl. No.: 773,360

[22] Filed: Dec. 26, 1996

[30] Foreign Application Priority Data

Dec. 27, 1995 [FR] France .................................. 95 15543

[51] Int. Cl.⁶ ...................................................... H01S 3/19
[52] U.S. Cl. ............................................... 372/46; 372/96
[58] Field of Search .................................. 372/46, 45, 96

[56] References Cited

U.S. PATENT DOCUMENTS

| | | | |
|---|---|---|---|
| 5,245,622 | 9/1993 | Jewell et al. .............................. | 372/45 |
| 5,493,577 | 2/1996 | Choquette et al. ........................ | 372/46 |
| 5,594,751 | 1/1997 | Scott ......................................... | 372/46 |

OTHER PUBLICATIONS

Seiiji Uchiyama et al, "GAINASP/INP Square Buried–Heterostructure Surface–Emitting Lasers Regrown by MOCVD", *IEICE Transactions on Electronics*, vol. E78–C, No. 9, 1 Sep. 1995, pp. 1312–1314.

G. S. Li et al, "Polarisation and Modal Behaviour of Low Threshold Oxide and Airgap Confined Vertical Cavity Lasers", *Electronics Letters*, vol. 31, No. 23, 9 Nov. 1995, pp. 2014–2015.

S. Rochus et al, "Vertical Cavity Surface–Emitting Lasers with Buried Lateral Current Confinement", *Compound Semiconductors 1994, San Diego*, Sep. 18–22, 1994, No. Proc. 21, 18 Sep. 1994, pp. 563–566.

G. M. Yang et al, "Ultralow Threshold Current Vertical–Cavity Surface–Emitting Lasers Obtained with Selective Oxidation", *Electronics Letters*, vol. 31, No. 11, 25 May 1995, pp. 886–888.

Toshihiko Baba et al, "Continuous Wave GAINASP/INP Surface Emitting Lasers With a Thermally Conductive MGO/SI Mirror", *Japanese Journal of Applied Physics*, vol. 33, No. 4A, Part 01, 1 Apr. 1994, pp. 1905–1909.

*Primary Examiner*—James W. Davie
*Attorney, Agent, or Firm*—Sughrue, Mion, Zinn, Macpeak & Seas, PLLC

[57] ABSTRACT

To improve the efficiency and to reduce the temperature rise of a surface emitting semiconductor laser, the laser includes between a buried active layer and a mirror, a current blocking layer incorporating an opening centered on the active layer and having dimensions less than those of the latter. Applications include optical telecommunication systems.

6 Claims, 2 Drawing Sheets

SURFACE EMITTING SEMICONDUCTOR LASER

BACKGROUND OF THE INVENTION

1. Field of the Invention

The invention concerns a particular class of semiconductor lasers known as Vertical Cavity Surface Emitting Lasers (VCSEL).

2. Description of the Prior Art

These lasers are fabricated on a substrate made of a type III–V semiconductor alloy such as gallium arsenide GaAs or indium phosphide InP.

Unlike conventional semiconductor lasers, the light is emitted perpendicularly to the surface of the active layer and in the same direction as that in which the electrical current sustaining the laser effect is injected. Thus, in the case of an InP substrate, the component essentially comprises a resonant cavity delimited by two opposed semiconductor or dielectric mirrors. The resonant cavity is formed of a p-doped InP layer, a GaInAsP quaternary active layer and a n-doped InP layer. The current is injected via two electrodes on respective opposite sides of the resonant cavity. At least one of these electrodes is necessarily placed alongside or more generally around the mirror on the same face. Correct functioning of a structure of this kind is conditioned by sufficient confinement of the active layer from the optical and electrical points of view. For this reason, a structure is generally chosen in which the active layer is buried in a medium having a lower refractive index. If the good conductor active layer is additionally buried in a p-doped medium at the boundary of the n medium, electrical confinement is also obtained because of the threshold voltage of the p-n junction surrounding the active layer.

To produce high-power continuous emission lasers it is necessary to strengthen the electrical confinement in order to improve the efficiency and to reduce the temperature rise of the component. One solution to this problem is proposed in the article "Continuous Wave GaInAsP/InP Surface Emitting Lasers with a Thermally Conductive MgO/Si Mirror", Toshihiko BABA et al, Japanese Journal of Applied Physics, Vol.33 (1994), pages 1905–1909, Part 1, N°4A, April 1994.

This article proposes to provide a blocking junction all around the buried active layer.

This solution enables the electrical confinement to be enhanced but efficiency is not optimized. Measurements and simulations on a structure of this kind show that the current density through the active layer is not uniform. To be more precise, the current density is higher (by a factor in the order of 4) at the periphery of the active layer than at its center. As a result the laser effect can be obtained only in an annular mode since the carrier density at the center is below that required to reach the laser threshold.

One aim of the invention is to propose a surface emitting laser structure having improved efficiency and consequently a lower temperature rise and therefore a lower threshold current.

SUMMARY OF THE INVENTION

To this end, the invention consists in a surface emitting laser including an active layer buried in an electrical current injection layer made of a p-doped III–V semiconductor alloy, at least one mirror parallel to said active layer on said injection layer, an electrode alongside said mirror and in electrical contact with said injection layer, and a current blocking layer in said injection layer in a plane substantially parallel to said active layer, said blocking layer having an opening centered relative to said active layer and having smaller dimensions than the latter.

The provision of an opening in the blocking layer smaller than the active layer compensates the eccentric nature of the injection of current due to the position of the electrode, which must not overlap the mirror. The position and the thickness of the blocking layer and the position and the dimensions of the opening can be optimized by simulation in order to obtain the most uniform possible current density at the active layer.

In accordance with one supplementary feature of the invention, said dimensions of said opening and the distance between said blocking layer and said active layer are chosen so that the electric current J (see FIG. 6) flowing through said active layer has a uniform current density. These two parameters are decisive for adjusting the distribution of the electrical potential within the structure and therefore for obtaining a uniform current density.

Other features of the invention will emerge from the remainder of the description given with reference to the accompanying drawings.

DETAILED DESCRIPTION OF THE PREFERRED EMBODIMENT

The fabrication steps of the laser of the invention are given for the specific example of an InP substrate. The method may be applied to any other substrate made from a III–V alloy such as GaAs, however.

Figure 1:
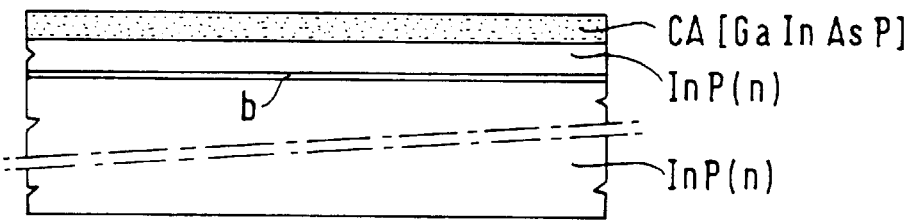
FIGS. 1 through 5 show the main steps in the fabrication of the laser of the invention.

As shown in FIG. 1, the method begins with a step of growing n-doped InP on a substrate of the same substance. A quaternary etch stop layer b is then formed. Next, n-doped InP is grown to a depth defining the distance between the active layer and the bottom mirror of the component. A quaternary active layer CA is then formed over all of the surface of the crystal.

Figure 2:
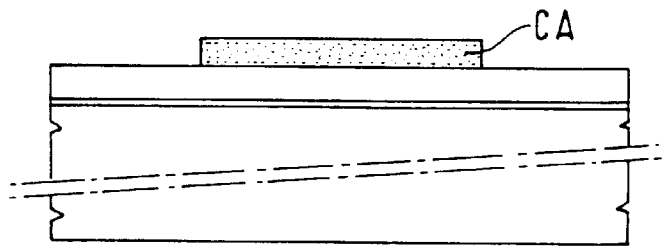

The layer CA is then etched to form an active layer mesa as shown in FIG. 2.

Figure 3:
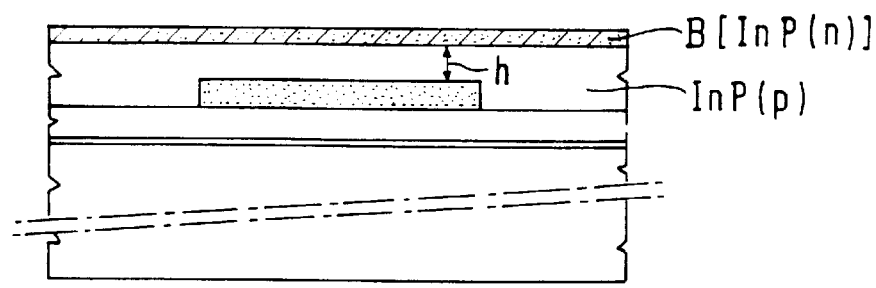

As shown in FIG. 3, p-doped InP is grown to bury the active layer CA. Growth of n-doped InP then produces a blocking layer B over all of the surface of the crystal. The distance h between the active layer and the blocking layer is adjusted accurately. This distance h can be obtained by simulation calculations with the aim of producing a uniform current density in the active layer.

Figure 4:
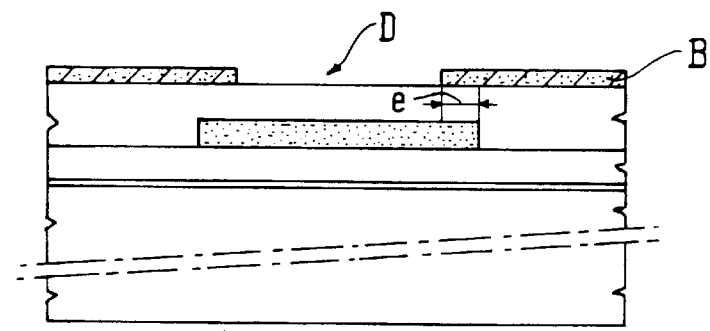

An opening D centered on the active layer is then formed by etching the blocking layer B (FIG. 4). The dimensions of the opening D are less than those of the active layer to produce an overhang e the precise magnitude of which is also obtained by simulation.

Figure 5:
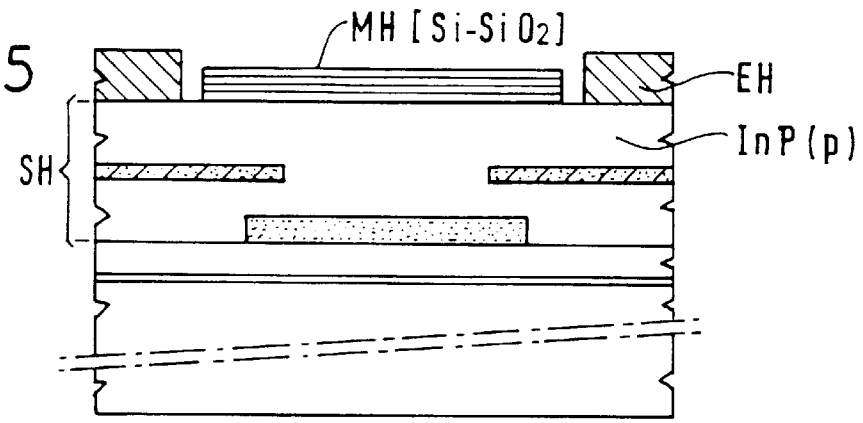

Referring to FIG. 5, further p-doped InP is then grown, which terminates the formation of the current injection layer SH. The top dielectric mirror MH is then formed from alternating Si—SiO$_2$ layers. Finally, the top electrode EH is formed around the mirror MH.

Figure 6:
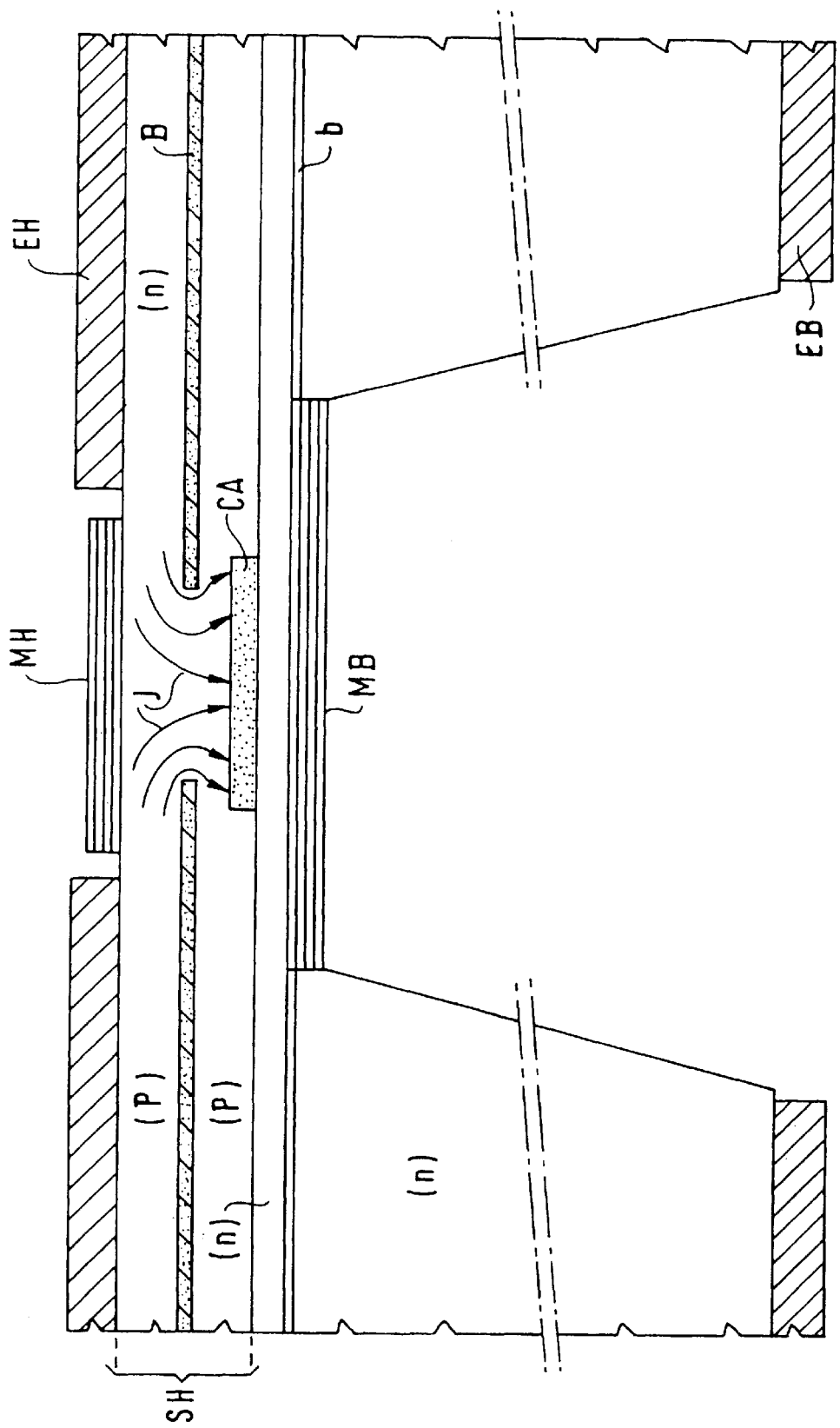
FIG. 6 is a sectional view of the laser of the invention.

To obtain the finished component shown in FIG. 6, the bottom part of the InP substrate is etched as far as the etch stop layer b, the bottom mirror MB is formed and the bottom electrode EB is applied.

Rather than producing the blocking layer B by growing n-doped InP, an electrical insulator such as aluminum oxide could be used. In another embodiment, the blocking layer B could be obtained by lateral etching of the injection layer SH. Note, however, that growing n-doped InP has the advantage of simplicity and of avoiding the problems of epitaxial regrowth where the lattice parameters of the oxide layer do not match those of the p-doped InP medium.

It should be made clear that the drawings are merely diagrammatic representations. The layers shown as plane are not necessarily plane in reality.

In particular, the blocking layer B will in practice have an upward deformation due to the additional epitaxial growth on the mesa visible in FIG. 2.

A few representative dimensions are now given by way of illustration only:

diameter of active layer CA: 8 $\mu$m thickness of active layer CA: 0.7 $\mu$m distance h between active layer CA and blocking layer B: 1 $\mu$m overhang e: 1 $\mu$m thickness of injection layer SH: 4 $\mu$m diameter of mirrors MH and MB: 10–16 $\mu$m

I claim:

1. A surface emitting laser comprising:

an active layer in a mesa configuration, buried in an electrical current injection layer made of a p-doped III–V semiconductor alloy, said active layer being bounded on three sides by said electrical current layer, at least one mirror parallel to said active layer on said injection layer, an electrode alongside said mirror and in electrical contact with said injection layer, and a current blocking layer in said injection layer in a plane substantially parallel to said active layer, said blocking layer having an opening centered relative to said active layer and having smaller dimensions than said active layer.

2. The laser claimed in claim 1, wherein said dimensions of said opening and the distance between said blocking layer and said active layer are chosen so that the electric current flowing through said active layer has a uniform current density.

3. The laser claimed in claim 1, wherein said blocking layer is made of the same III–V semiconductor alloy, but n-doped.

4. The laser claimed in claim 1, wherein said blocking layer is made from an electrical insulator.

5. The laser claimed in claim 4, wherein said insulator is aluminum oxide.

6. The laser claimed in claim 4, wherein said blocking layer is a notch obtained by lateral etching in said injection layer.

* * * * *